(12) United States Patent
Lee et al.

(10) Patent No.: US 6,301,694 B1
(45) Date of Patent: *Oct. 9, 2001

(54) HIERARCHICAL CIRCUIT PARTITIONING USING SLIDING WINDOWS

(75) Inventors: Fung Fung Lee, Milpitas; John Tse, El Cerrito, both of CA (US)

(73) Assignee: Altera Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/936,112

(22) Filed: Sep. 24, 1997

Related U.S. Application Data

(60) Provisional application No. 60/026,692, filed on Sep. 25, 1996.

(51) Int. Cl.[7] ................................................ G06F 17/50
(52) U.S. Cl. ........................... 716/11; 716/2; 716/7; 716/9
(58) Field of Search ................... 395/500.08, 500.09, 395/500.1, 500.11; 716/7, 8, 9, 10, 11, 2

(56) References Cited

U.S. PATENT DOCUMENTS

| | | | |
|---|---|---|---|
| 3,617,714 | * 11/1971 | Kernighan et al. | 395/500.08 |
| 4,617,479 | 10/1986 | Hartmann et al. . | |
| 4,791,590 | 12/1988 | Ku et al. . | |
| 4,871,930 | 10/1989 | Wong et al. . | |
| 4,903,107 | 2/1990 | Chan et al. . | |
| 4,918,379 | 4/1990 | Jongepier . | |
| 5,031,111 | 7/1991 | Chao et al. . | |
| 5,128,871 | 7/1992 | Schmitz . | |
| 5,187,671 | 2/1993 | Cobb . | |
| 5,189,628 | * 2/1993 | Olsen et al. | 364/489 |
| 5,218,551 | * 6/1993 | Agrawal et al. | 364/491 |
| 5,224,056 | 6/1993 | Chene et al. . | |
| 5,229,953 | 7/1993 | Isozaki et al. . | |
| 5,241,224 | 8/1993 | Pedersen et al. . | |
| 5,260,610 | 11/1993 | Pedersen . | |

(List continued on next page.)

OTHER PUBLICATIONS

Hamada et al., "An Efficient Multi–Level Placement Technique Using Hierarchical Partitioning," IEEE, pp. 2044–2047, 1991.*

Limqueco et al., "Optimizing Large Networks by Repeated Local Optimization Using a Windowing Scheme," pp. 1993–1996, IEEE, 1992.*

Hassoun et al., "Graph Partitioning Using a Reduced Connectivity Matrix for VLSI Applications," IEEE, pp. 2040–2043, 1991.*

Overhauser et al., "Multilevel Circuit Partitioning for Switch–Level Timing Simulation," ISCAS88, pp. 1361–1364, 1988.*

(List continued on next page.)

*Primary Examiner*—Matthew Smith
*Assistant Examiner*—Leigh Marie Garbowski
(74) *Attorney, Agent, or Firm*—Townsend and Townsend and Crew LLP

(57) ABSTRACT

Systems and methods of hierarchical circuit partitioning are provided. More specifically, the invention utilizes a sliding window which is moved over portions of a hierarchical structure representing a programmable logic device. The window includes some but not all containers of the hierarchical structure so that logic cells may be partitioned within the window. After the logic cells are partitioned in the window, the window is moved to a different location of the hierarchical structure. By utilizing a sliding window, the invention is able to recursively partition logic cells into portions of the hierarchical structure which increases the overall efficiency of the partitioning.

23 Claims, 9 Drawing Sheets

U.S. PATENT DOCUMENTS

| | | |
|---|---|---|
| 5,260,611 | 11/1993 | Cliff et al. . |
| 5,305,229 | 4/1994 | Dhar . |
| 5,309,371 | 5/1994 | Shikata et al. . |
| 5,311,443 | 5/1994 | Crain et al. . |
| 5,341,308 | 8/1994 | Mendel . |
| 5,359,538 | 10/1994 | Hui et al. . |
| 5,392,227 | 2/1995 | Hiserote . |
| 5,469,003 | 11/1995 | Kean et al. . |
| 5,475,830 | 12/1995 | Chen et al. . |
| 5,477,474 | 12/1995 | Southgate et al. . |
| 5,485,396 | 1/1996 | Brasen et al. . |
| 5,485,547 | 1/1996 | Maruno . |
| 5,495,419 * | 2/1996 | Rostoker et al. ............ 364/468 |
| 5,513,124 | 4/1996 | Trimberger et al. . |
| 5,519,629 | 5/1996 | Snider . |
| 5,521,836 | 5/1996 | Hartoog et al. . |
| 5,557,533 | 9/1996 | Koford et al. . |
| 5,574,893 | 11/1996 | Southgate et al. . |
| 5,636,125 * | 6/1997 | Rostoker et al. ......... 364/468.28 |
| 5,745,363 * | 4/1998 | Rostoker et al. ......... 364/468.28 |
| 5,825,660 * | 10/1998 | Cagan et al. ............... 364/491 |
| 5,847,965 * | 12/1998 | Cheng ........................ 364/488 |
| 5,870,313 * | 2/1999 | Boyle et al. ................ 364/491 |
| 5,892,682 * | 4/1999 | Hasley et al. .............. 364/488 |
| 5,903,461 * | 5/1999 | Rostoker et al. ......... 364/468.28 |
| B1 4,617,479 | 9/1993 | Hartmann et al. . |

OTHER PUBLICATIONS

Wei et al., "Towards Efficient Hierarchical Designs by Ratio Cut Partitioning," IEEE, pp. 298–301, 1989.*

Chatterjee et al., "A New Simultaneous Circuit Partitioning and Chip Placement Approach Based on Simulated Annealing," Proceedings of Design Automation Conference, 1990, pp. 36–39.

Kernigham B. W. and S. Lin, "An Efficient Heuristic Procedure for Partitioning Graphs," The Bell Systems Technical Journal, Feb. 1970, vol. 49, No. 2, pp. 291–307.

Krishnamurthy, "An Improved Min–Cut Algorithm for Partitioning VLSI Networks," IEEE Transactions on Computers, May 1984, vol. C–33, No. 5, pp. 438–446.

Laura A. Sanchis "Multiple–Way Network Partitioning", IEEE Transcations on Computers, Jan. 1989, vol. 38, No. 1, pp. 62–81.

Altera Corporation, 1995 Data Book, "Max+Plus II, Programmable Logic Development System & Software," Version 6, Mar. 1995, pp. 511–526.

Altera Corporation, 1995 Data Sheet, "Flex 10K, Embedded Programmable Logic Family," Version 1, Jul. 1995, pp. 1–56.

Altera Corporation, 1995 Data Book, "Flex 8000, Programmable Logic Device Family," Version 6, Mar. 1995, pp. 37–115.

Altera Corporation, 1995 Data Book, "Max 9000, Programmable Logic Device Family," Mar. 1995, Version 2, pp. 119–152.

* cited by examiner

HIERARCHICAL CIRCUIT PARTITIONING USING SLIDING WINDOWS

This application claims the benefit of Provisional Application Ser. No. 60/026,692, filed Sep. 25, 1996 and incorporated herein by reference.

BACKGROUND OF THE INVENTION

The present invention relates to the field of hierarchical graph partitioning. More specifically, the present invention provides a hierarchical circuit partitioning method for programmable logic devices (PLDs).

As integrated circuits (ICs) become faster, smaller and less expensive, integrated circuits increasingly impact almost every aspect of our daily lives. Although advances in semiconductor fabrication have drastically reduced the cost for producing conventional integrated circuits, the design process is still very expensive and time consuming.

Programmable logic devices (PLDs) offer an alternative to conventional ICs. PLDs are a type of integrated circuit having programmable logic elements and a programmable interconnect. Because PLDs may be programmed to emulate desired digital circuits, the development time needed to go from design to chip implementation may be reduced.

One particular class of PLDs is CPLDs. Each CPLD generally includes two components, logic elements and interconnections. The logic elements may be programmed or configured to perform specific logic functions, for example, NAND, NOR, exclusive OR, etc. The interconnections are routing resources that may be programmed to interconnect the logic elements with each other and with external input/output pins.

Although PLDs have distinct advantages over conventional ICs, configuring the devices is often difficult and computationally expensive. For example, the logic functions must be partitioned (i.e., mapped) among the various logic elements. Poor partitioning wastes interconnection resources and limits the number of functions that may be placed on a PLD.

Similar partitioning problems are found in many other areas. For example, in parallel processing applications, processing tasks must be efficiently partitioned among specific processors. Other partitioning problems will be readily apparent to those of skill in many various arts. In general, the problem is mapping a number of interconnected elements (i.e., logic functions) to a set of resources (i.e., logic elements.)

It is known to arrange these types of partitioning problems as hierarchical graphs. This allows mathematical and computer programming techniques to be used in solving the problem. The graph is arranged with interconnected nodes (or containers) representing the resources and elements representing the elements to be partitioned amongst the elements.

Finding an optimal solution to the problem of graph partitioning is computationally difficult. As the number of elements and resources increase, the number of computations expands exponentially. For large numbers of elements and resources, finding the optimal solution is not possible in a practical sense. Consequently, heuristic techniques have been developed to find good solutions in a reasonable amount of time. However, as PLDs become more and more dense, improved techniques are desirable to closer approximate the optimal solution, and to efficiently manage the number of computations.

Accordingly, there is a need for improved techniques for partitioning hierarchical graphs, and in particular, for an efficient technique for partitioning logic function to particular logic elements within a PLD.

SUMMARY OF THE INVENTION

The present invention provides systems and methods for partitioning hierarchical graphs. It is useful, for example, in mapping logic functions to specific logic elements of a PLD.

The system takes as input a set of elements (i.e., logic functions) and partitions them among various resources represented by containers or nodes of a graph (i.e., logic elements.) An initial partitioning is done by placing each of the elements into containers. Then, the system defines a window over a subportion of the graph, and repartitions the elements within that window. The system slides the window to a new location, and repeats the repartitioning for the elements within the newly located window. This provides an efficient method for partitioning a graph. In one embodiment, this process is recursive, and the window slides recursively from the root of the hierarchical graph to the leaf nodes.

In an embodiment of the invention, if problems are encountered while the elements are being partitioned, the problems are recorded. Typically, these problems prevent the elements from being legally placed within the window. When the window is moved to a previous location of the hierarchical structure in which problems have been recorded, the recorded problems may be taken into account so that the problems will not appear during subsequent partitioning.

In another aspect of the invention, a window may be optionally inflated to a larger size if the elements within the window of the hierarchical structure are not legally placed. By increasing the size of the window, the invention may analyze more information which allows the elements to be legally placed within the containers of the window.

Typically, the window is then deflated back to its original size after the partitioning succeeds.

Other features and advantages of the present invention will become apparent upon consideration of the following detailed description and the accompanying drawings, in which like reference designations represent like features throughout the figures.

DETAILED DESCRIPTION OF SPECIFIC EMBODIMENTS

Figure 1:
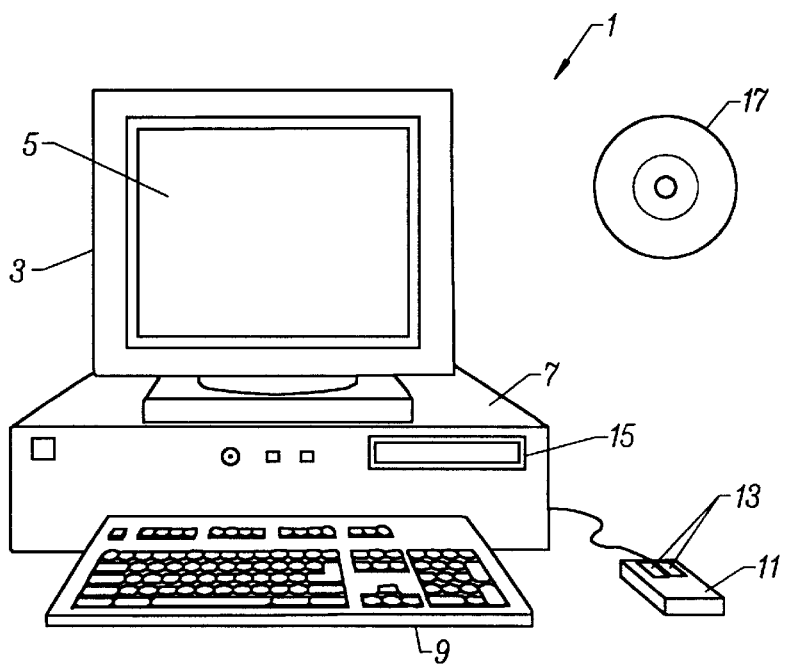
FIG. 1 illustrates an example of a computer system that may be used to execute software embodiments of the present invention.

FIG. 1 illustrates an example of a computer system that may be used to execute software embodiments of the present invention. FIG. 1 shows a computer system 1 which includes a monitor 3, screen 5, cabinet 7, keyboard 9, and mouse 11. Mouse 11 may have one or more buttons such as mouse buttons 13. Cabinet 7 houses a CD-ROM drive 15 and a hard drive (not shown). These, or other storage devices may be used to store and retrieve software programs, including computer code incorporating the present invention. Although a CD-ROM 17 is shown as the computer readable medium, other computer readable media including floppy disks, DRAM, hard drives, flash memory, tape, tape cartridges, and the like may be also be used. Cabinet 7 also houses familiar computer components (not shown) such as a processor, memory, and the like.

Figure 2:
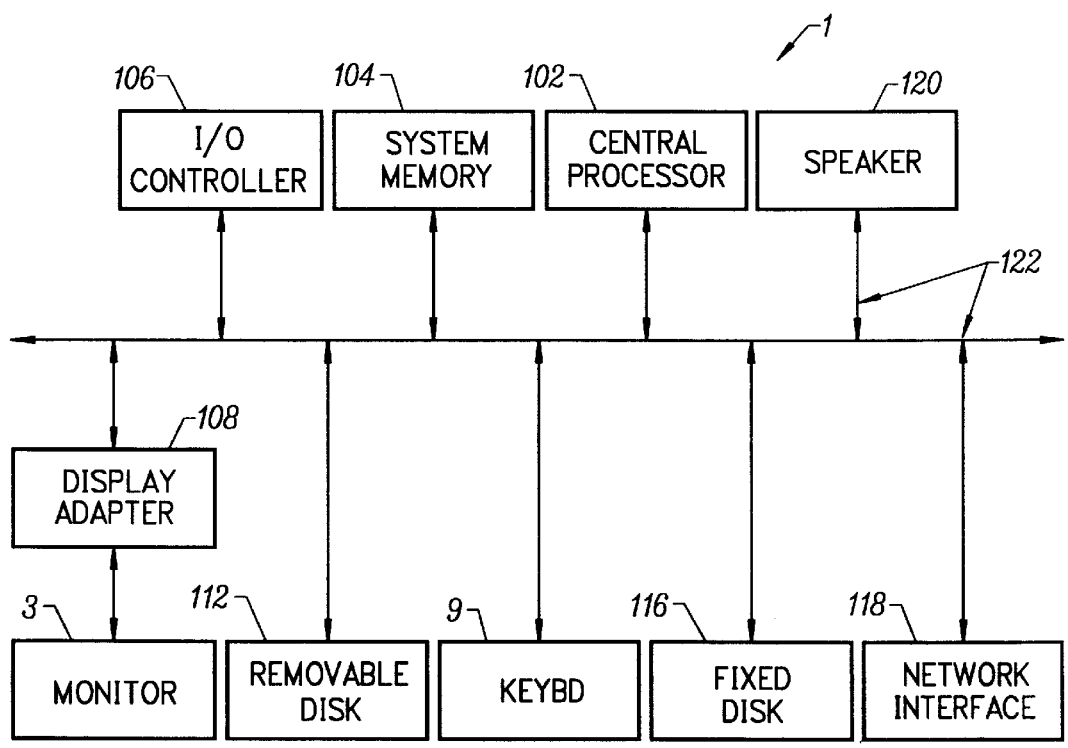
FIG. 2 shows a system block diagram of a typical computer system.

FIG. 2 shows a system block diagram of computer system 1 used to execute software embodiments of the present invention. As in FIG. 1, computer system 1 includes monitor 3 and keyboard 9. Computer system 1 further includes subsystems such as a central processor 102, system memory 104, I/O controller 106, display adapter 108, removable disk 112, fixed disk 116, network interface 118, and speaker 120. Removable disk 112 is representative of removable computer readable media like floppy disks, tape, tape cartridges, CD-ROM, removable hard drive, flash memory, and the like. Fixed disk 116 is representative of an internal hard drive or the like. Other computer systems suitable for use with the present invention may include additional or fewer subsystems. For example, another computer system could include more than one processor 102 (i.e., a multi-processor system) or memory cache.

Arrows such as 122 represent the system bus architecture of computer system 1. However, these arrows are illustrative of any interconnection scheme serving to link the subsystems. For example, display adapter 108 may be connected to central processor 102 through a local bus, or the system may include a memory cache. Computer system 1 shown in FIG. 2 is but an example of a computer system suitable for use with the present invention. Other configurations of subsystems suitable for use with the present invention will be readily apparent to one of ordinary skill in the art.

Figure 3:
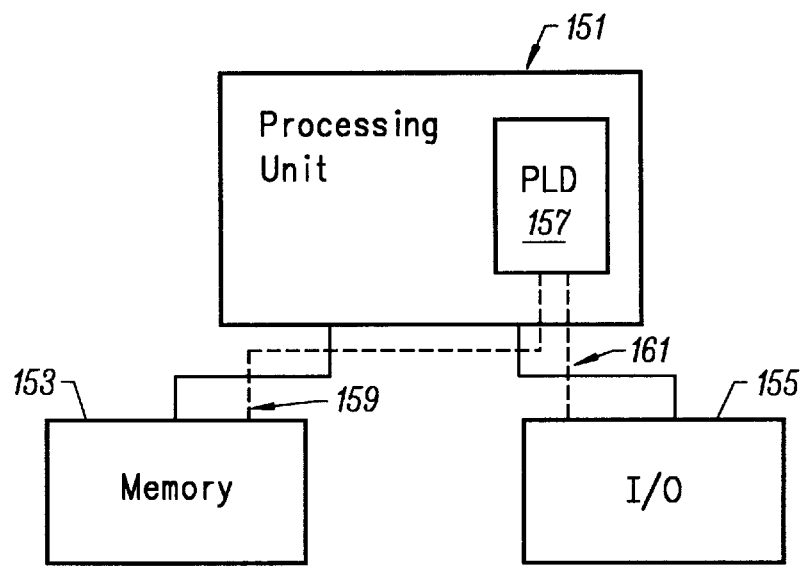
FIG. 3 is a block diagram of a digital system incorporating a PLD.

FIG. 3 shows a block diagram of a digital system within which a PLD of the present invention may be embodied.

In the particular embodiment of FIG. 3, a processing unit 151 is coupled to a memory 153 and an input/output device (I/O) 155. The digital system incorporates at least one programmable logic device (PLD) 157. PLD 157 may be specially coupled to memory 153 through connection 159 and to I/O 155 through connection 161. The system may be a programmed digital computer system, digital signal processing system, specialized digital switching network, or any other processing system. Moreover, the system may be a general purpose computer, a special purpose computer (such as telecommunications equipment) optimized for an application-specific task such as programming PLD 157, or a combination of a general purpose computer and auxiliary special purpose hardware.

Processing unit 151 may direct data to an appropriate system component for processing or storage of data, execute a program stored in memory 153 or input using I/O 155, or other similar function. Processing unit 151 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 157 may control the logical operations of the system.

Figure 4:
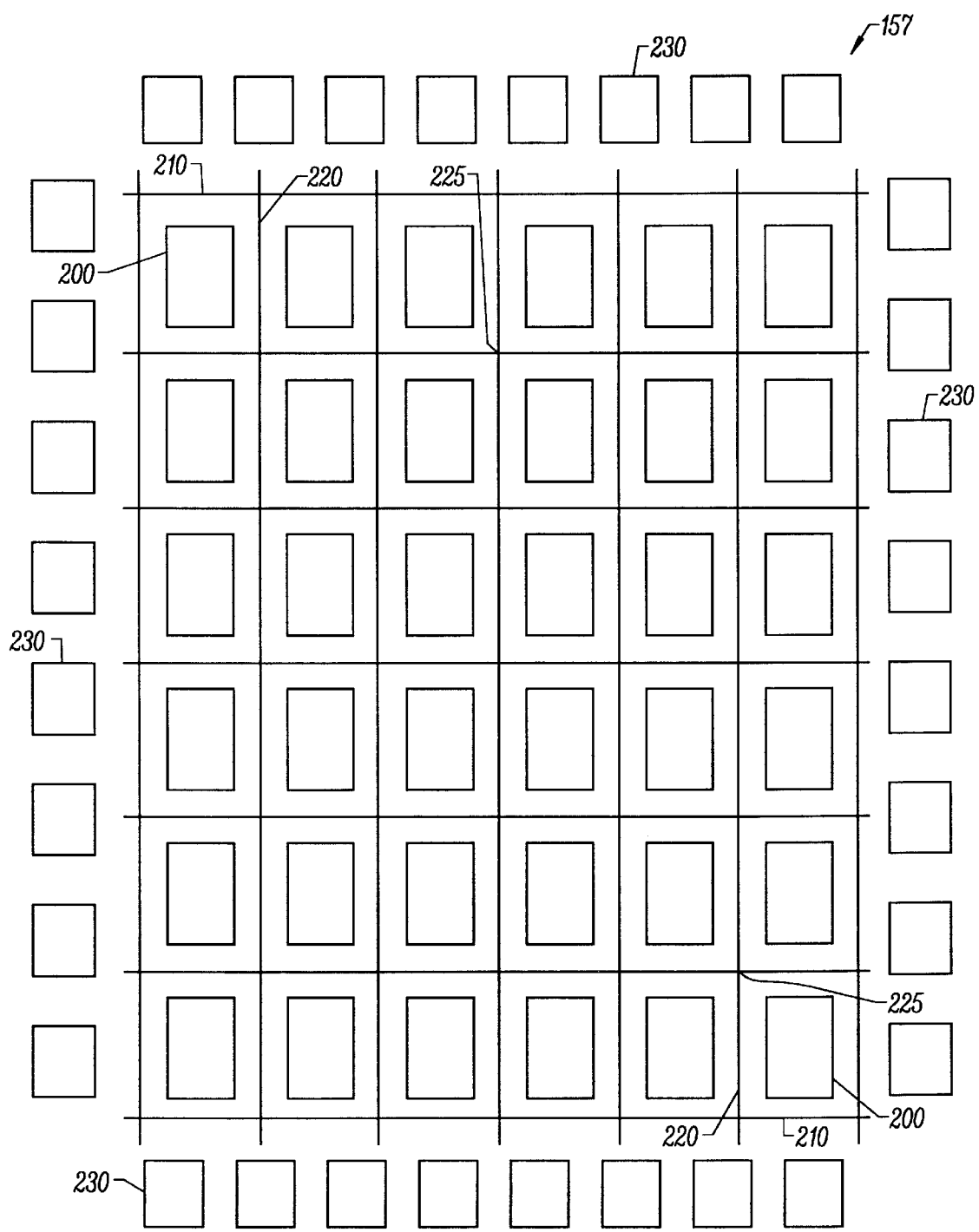
FIG. 4 is a block diagram showing the overall architecture of a PLD.

FIG. 4 is a simplified block diagram of the overall internal architecture and organization of an exemplary PLD 157 of FIG. 3. Many details of PLD architecture, organization, and circuit design are not necessary for an understanding of the present invention and such details are not shown in FIG. 4. Exemplary PLDs 157 are produced by The Altera Corporation in San Jose, Calif. Additional details of the exemplary PLDs may be found, for example, in The Altera Data Book, June 1996, which is incorporated herein by reference for all purposes.

FIG. 4 shows a six-by-six two-dimensional array of thirty-six logic array blocks (LABs) 200. LAB 200 is a physically grouped set of logical resources that is configured or programmed to perform logical functions. PLDs may contain any arbitrary number of LABs, more or less than the number shown in PLD 157 of FIG. 4. Generally, in the future, as technology advances and improves, programmable logic devices with even greater numbers of logic array blocks will undoubtedly be designed. Furthermore, LABs 200 need not be organized in a square matrix. LABs 200 may be organized in an array of any number of rows and columns.

LAB 200 has inputs and outputs (not shown) which may or may not be programmably connected to a global interconnect structure. The global interconnect is organized with an array of global horizontal interconnects (GHs) 210 and global vertical interconnects (GVs) 220. Although shown as single lines in FIG. 4, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200. The PLD architecture in FIG. 4 further shows, at the peripheries of the chip, input-output drivers 230. Input-output drivers 230 are for interfacing the PLD to external, off-chip circuitry.

Further details of an exemplary global interconnect structure may be found, for example, in commonly assigned U.S. Pat. No. 5,260,610 entitled "Programmable Logic Element Interconnections for Programmable Logic Array Integrated Circuits", and commonly assigned U.S. Pat. No. 5,260,611 entitled "Programmable Logic Array having Local and Long Distance Conductors", both of which are incorporated herein by reference for all purposes.

Figure 5:
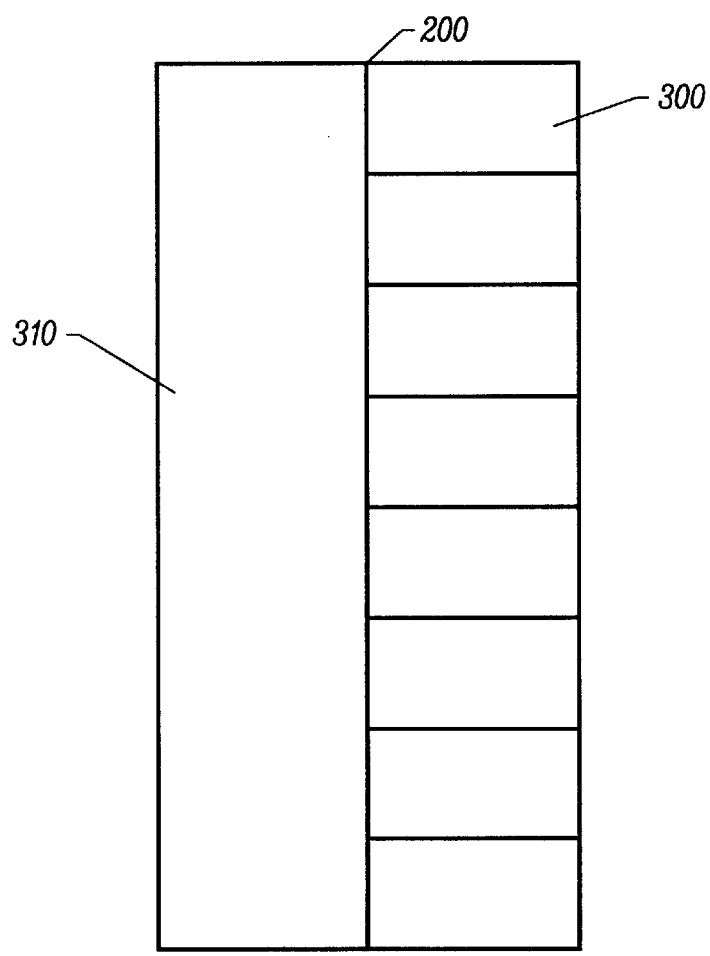
FIG. 5 is a simplified block diagram of a logic array block (LAB) of a PLD.

FIG. 5 shows a simplified block diagram of LAB 200 of FIG. 4. LAB 200 is comprised of a varying number of logic elements (LEs) 300 and a local (or internal) interconnect structure 310. Exemplary structures for logic element 300 and LAB 200 are described in more detail in, for example, the *Altera Data Book*, June 1996, previously referenced above.

Figure 6A:
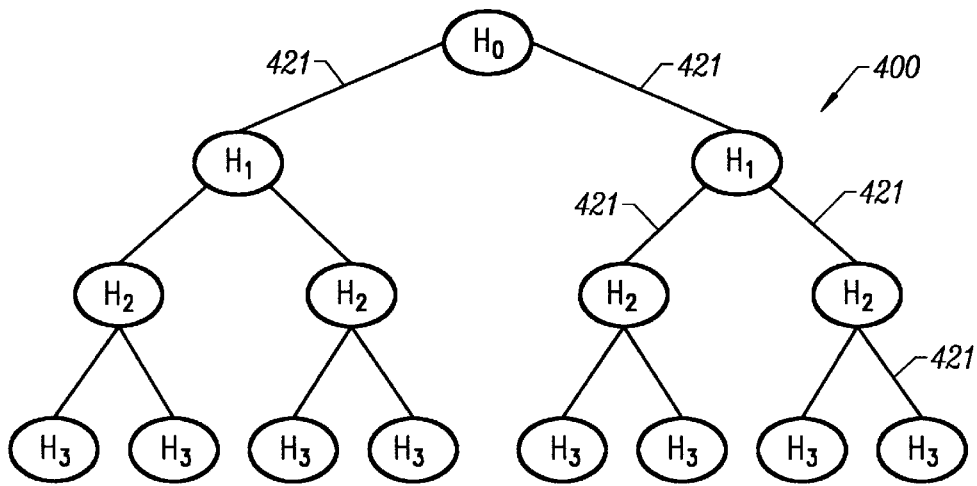
FIG. 6A shows a homogeneous hierarchical structure.

FIG. 6A shows a homogeneous hierarchical structure representative of a network of elements. Hierarchical structure 400 includes a number of containers or nodes $H_i$, where i represents the level of the container. As shown, $H_0$ is the root container which includes two containers $H_1$. Each $H_1$ includes two $H_2$ containers and so on. The hierarchical relationship is shown by lines (or edges as they are known in graph theory) 421. An edge 421 indicates a parent-child relationship between two containers. Those containers which have no children, (i.e., containers $H_3$) are known as leaf containers. They represent the lowest level of hierarchy. All elements are placed in one of the leaf containers. Containers above the leaf container level contain all the elements in the leaf containers that are their children.

For simplicity, the hierarchical structure is shown as being homogenous (i.e., each container includes the same number of containers). However, the invention may also be advantageously applied to heterogeneous hierarchical structures by an extension of the principles described herein.

The hierarchical graph represents a hierarchical relationship between resources in a system. Containers at each level of the graph represent a particular resource. Interconnections between elements are represented by a path in the graph along edges 421. Therefore, elements in a particular container can only be connected to elements in another container by means of the resources represented by the containers in a path connecting the two containers.

Figure 6B:
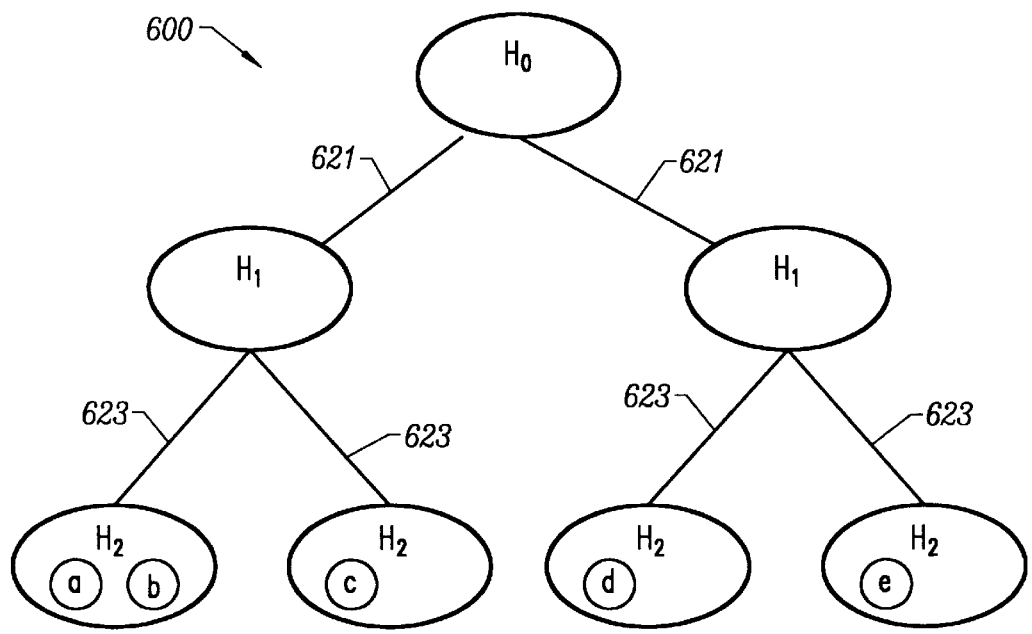
FIG. 6B shows a hierarchical structure representative of a PLD.

A clearer understanding may be possible with respect to a specific example. FIG. 6B illustrates a hierarchical structure 600 that is representative of a PLD. Elements, also referred to herein as "logic cells" a, b, c, d, and e represent logic functions that are assigned to particular logic elements 300 within LABs 200. Leaf containers at level $H_2$ represent LABs 200. Through local interconnections in LABs 200, any logic element 300 within a leaf container may be connected to any other logic element 300 within the same leaf container.

The $H_1$ level represents rows of LABs 200. Each row can be interconnected with GH interconnect lines 210 as shown in FIG. 4. Similarly, the $H_0$ level represents the entire PLD which is made up of several rows. GV interconnect lines 220 may interconnect different GH interconnect lines 210. To connect two logic elements 300 by means of GH interconnect lines 210, they must be connected by a path that does not include a container higher than the $H_1$ level. For example, a LAB 200 containing element a can be connected by GH interconnect lines 210 to a LAB containing element c. However, it cannot be directly connected by GH interconnect lines 210 to a LAB 200 containing element e, since a path between them cannot be found that does not pass through the $H_0$ level. Similarly, if a path between elements includes the $H_0$ container, then both GH interconnect lines 210 and GV interconnect lines 220 must be used to connect them. Accordingly, a LAB 200 containing element a can be connected to a LAB 200 containing element e by means of GH interconnect lines 210 and GV interconnect lines 220 since a path between them includes both $H_0$ and $H_1$ level containers.

In hierarchical structure 600, each container has a resource vector R associated with it. Resource vector R specifies the number of cells, clears, product terms, and the like that may be legally placed within the container. If placing an element in a container causes the number of resources to exceed the resource vector R, then that logic cell is declared to be illegally placed.

A cost function F( ) is also associated with each container in the hierarchical structure. The cost function F( ) is a value based on some combination of resource usage. Different ways of calculating F( ) will be apparent to one of skill in the art. Typically, F( ) is a measure of how unlikely the container is to be routed successfully. Typically, some combination of resource usage from R and the number of interconnections to and from the container determines the value of F( ). In general, the lower the resource usage and the fewer the number of interconnections, the more likely the hierarchical structure will be routed, and hence the lower the value of F( ).

In the specific embodiment, F( ) is a function of a cut-size C. Cut-size C is the number of nets (i.e., interconnections) between different parts of a partition. For example, the cut-size C may be defined as the number of nets that connect cells assigned to more than one $H_1$ container. Instead of counting each net equally, it may be advantageous to multiply the nets at different hierarchical level by a different weight factor w to get a weighted cut-size.

In the specific embodiment, a goal of partitioning is to place all logic cells legally into the hierarchical structure such that the overall cost is at a minimum. This allows the most function to be placed in the PLD as possible. The present invention uses a sliding window W to partition logic cells within some, but not all, of the containers of the hierarchical structure. The window W is moved to different locations in the hierarchical structure and the portion of the graph that is contained within the window is partitioned at each location. During each iteration of partitioning, only a subgraph representing the containers within W are of concern in doing the partition.

During each iteration of partitioning, there are two objectives:

1) place all the logic cells within W legally, and
2) minimize a generic cost function F( ) for all containers within W.

Figure 7:
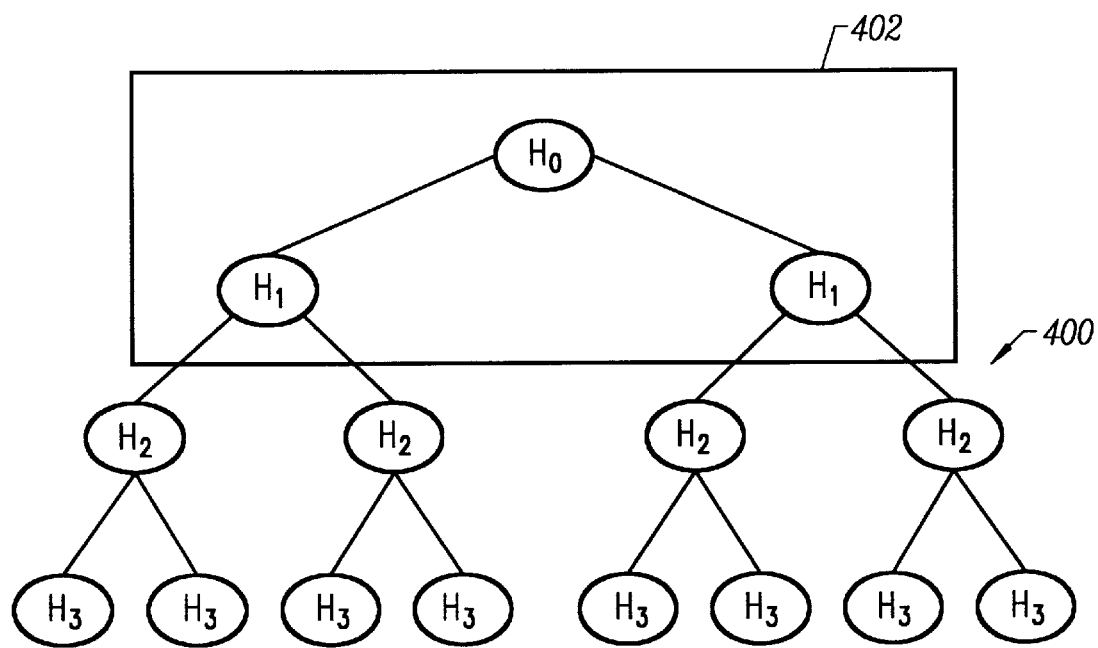
FIG. 7 shows an initial window on the hierarchical structure for partitioning.

In order to illustrate an example cost function, it may be beneficial to refer to a window W over the hierarchical structure. FIG. 7 shows an initial window on the hierarchical structure for partitioning. A window W 402 includes the root container and the containers at the next lower level. Although the window is shown with a depth d of one (i.e., includes two levels), the window may be of any depth, preferably selected to correspond to the processing power available.

An example of a cost function for a window with two levels may be $F( )=w_k C_k + w_{k+1}[\max(\text{all } C_{k+1} \text{ in W})]$ where k is equal to the level of the root container in the window (as shown k=0), $w_k$ and $w_{k+1}$ are weights (typically $w_k > w_{k+1} > \ldots >= 0$), and $C_k$ and $C_{k+1}$ are cut-sizes. The weights $w_k$ are multiplier values for increasing the relative importance and effect of a the cost at a particular level. If desired, the weights $w_k$ may be dynamically changed to reflect abundance or scarcity of a particular resource.

It would be desirable to minimize the cost of the containers within W while looking ahead and paying some attention to the cost of lower containers. The cost function F( ) above is but one way of measuring the cost to reach this goal. Other cost functions may also be desirable.

Figure 8:
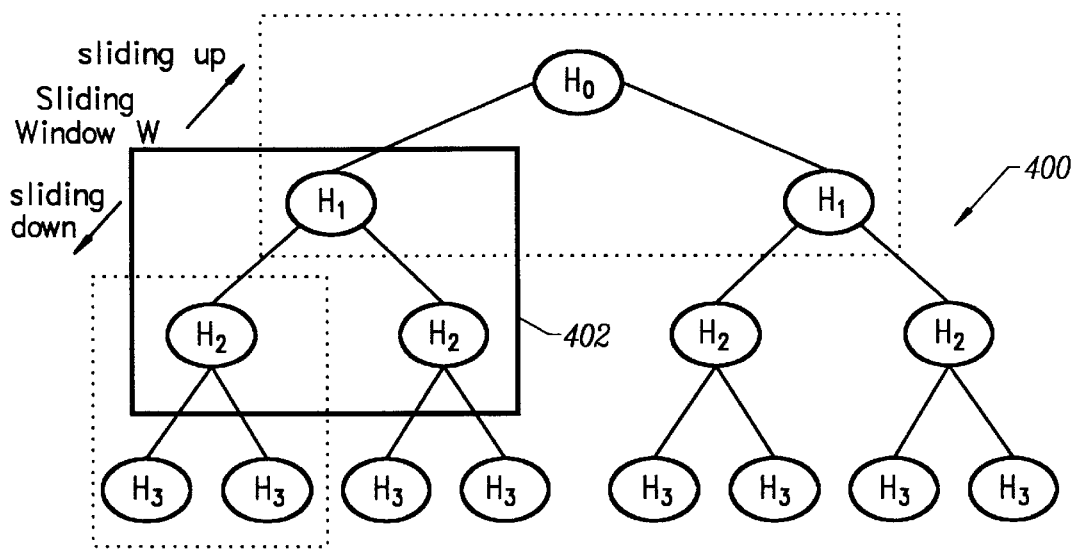
FIG. 8 shows examples of how the window may slide over the hierarchical structure during partitioning.

During each iteration, if all the logic cells may be placed within W legally (objective 1), then this iteration is successful. Then the window is moved and a new iteration begins for W at the new position. FIG. 8 shows examples of how the window may slide over the hierarchical structure during partitioning in the specific embodiment. Although the figure shows a depth-first order, other orders including breadth-first order may be utilized.

Figure 10A:
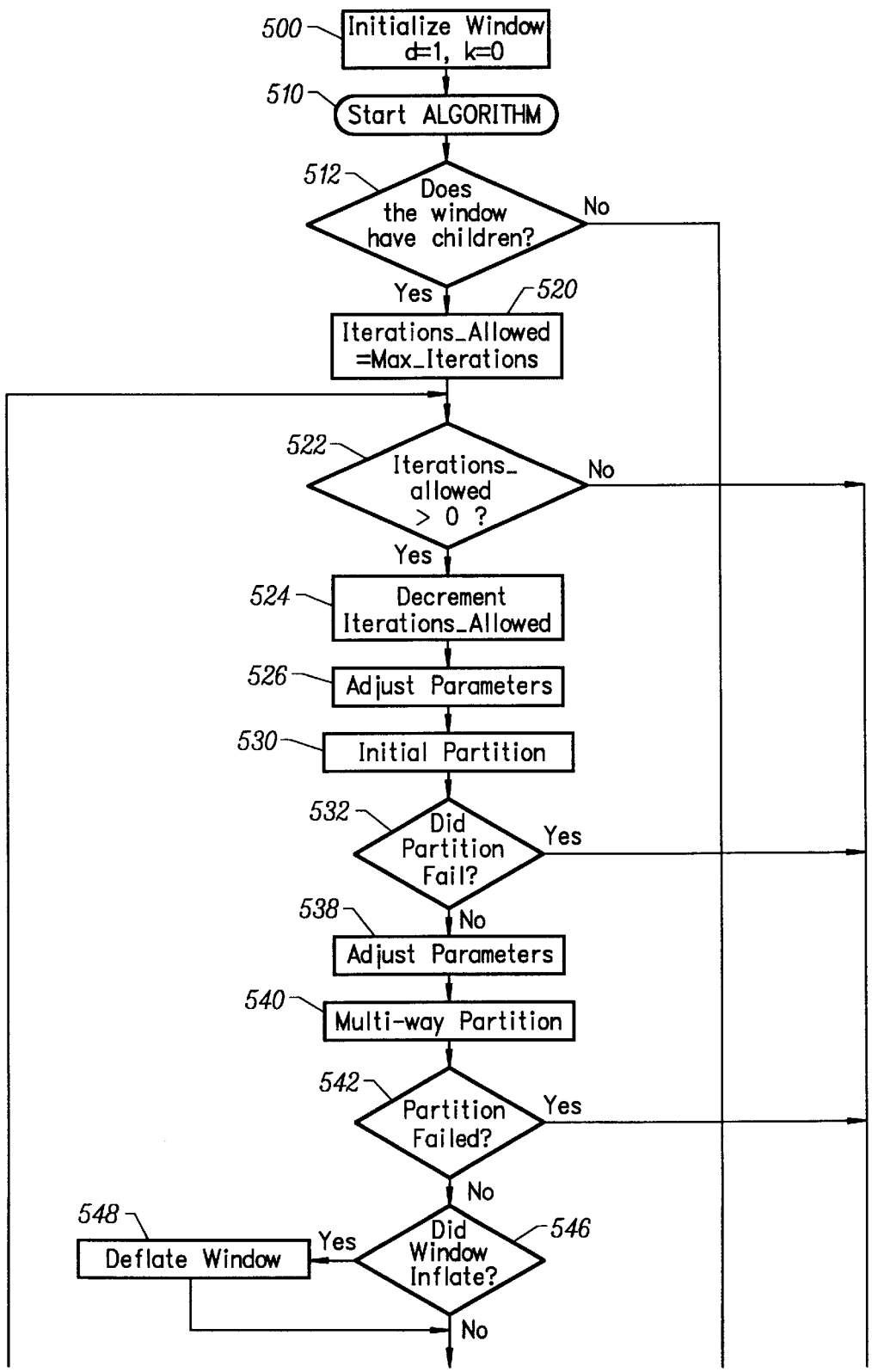
FIGS. 10A and 10B illustrate a flowchart of a process of hierarchical partitioning utilizing sliding windows.
Figure 10B:
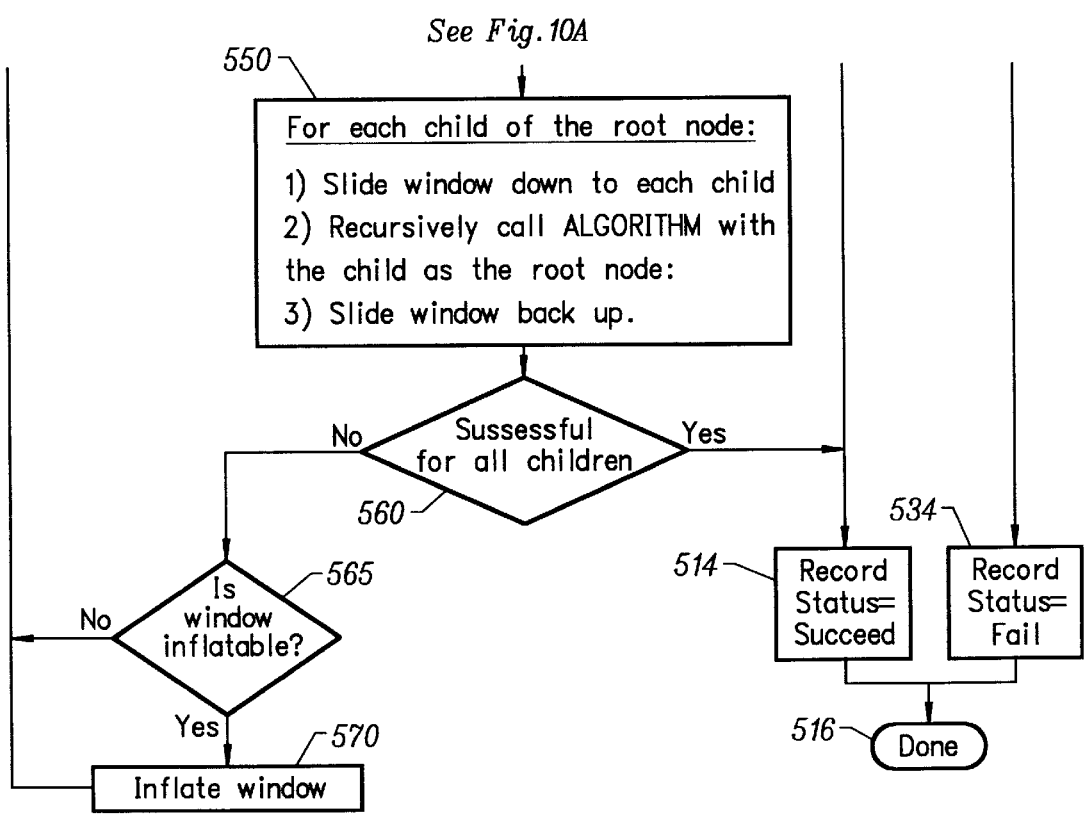

If an iteration fails (i.e., no legal partitioning is found,) the window is slid one level up and a previous iteration is repeated. However, since the reasons why the iteration failed may be recorded, the logic cells may be partitioned taking into account the recorded problems. Examples of what information is recorded and how to put this information to use is described below with respect to FIG. 10 below. Briefly, more restrictive resource checking may be performed in placing the logic cells within W legally (objective 1) or by changing the cost function F( ) (objective 2).

Figure 9:
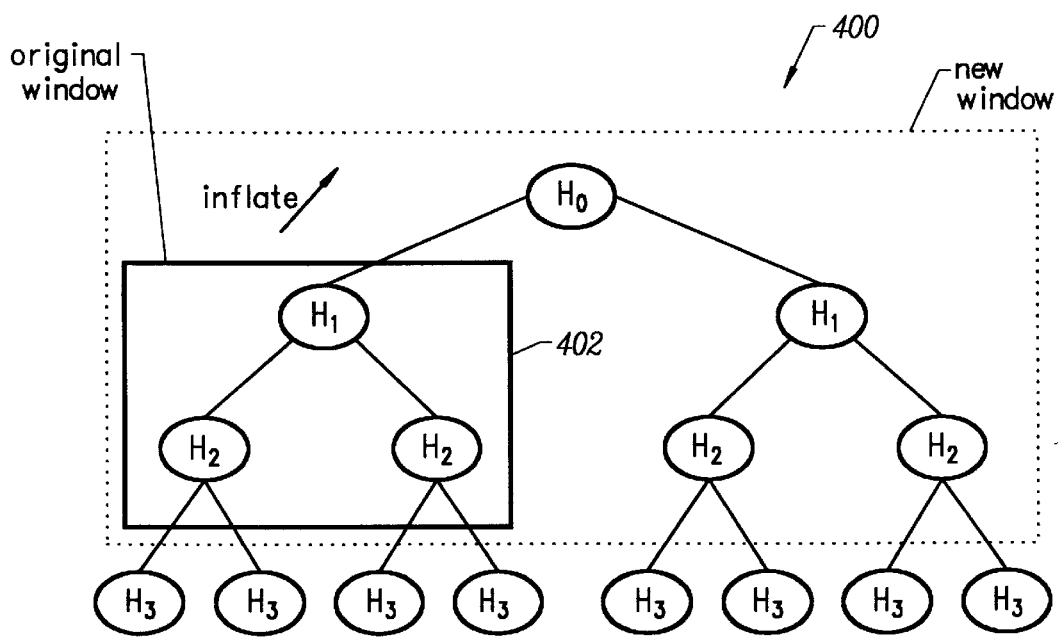
FIG. 9 shows a window inflating to a larger size to include containers having previously legally placed logic elements.

Optionally, window W may be inflated to a larger size to include more containers. The larger window may include logic cells that were previously placed legally. FIG. 9 shows an inflated window. When an iteration fails, the window may be inflated by dynamically adjusting the depth d of window W. Thus, instead of sliding W up one level, W may be inflated to include the parent level above W (e.g., the depth of W is increased by one). If the new W partitions successfully, W may then be shrunk to its original size, slid back to its previous location and logic cells partitioned within W.

Preferably, it would be desirable to limit the maximum size of a window since it usually takes longer to partition a bigger window. This may be accomplished by specifying the maximum number of containers in the bottom-most level in the window. Once this maximum number is reached, the window will not be allowed to inflate further.

As has been described, logic cells are partitioned within a window of the hierarchical structure. If the partition is successful, the window may be slid in a depth-first order over the hierarchical structure. If the partition fails, the window may be slid up one level adjusting for the problems encountered. Alternatively, if the partition fails, the window may be inflated. The invention will now be described in reference to FIGS. 10A and 10B (collectively FIG. 10).

FIG. 10 illustrates a flowchart of a process of hierarchical partitioning using sliding windows. The inputs to the process may be a network of logic cells, a hierarchical structure H, a sliding window W with a depth d, a cost function F( ), a boolean variable allow_window_to_inflate, an integer variable max_iterations, and an integer variable max_bottom_containers_in_window. The outputs may be a partitioning result (success or failure) and the assignments of logic cells to H. Although these inputs and outputs may be utilized, these inputs and outputs are provided to illustrate the invention and do not limit the invention to any one embodiment. For example, the network of logic cells could easily be replaced with other interconnected elements such as a network of interconnected processors.

In the specific embodiment, an algorithm recursively partitions the network of logic cells into the hierarchical structure H. That is, an initial window W is input to the algorithm, a partitioning is done on the window and then the window is moved. The algorithm calls itself with the new window. This continues until the ending conditions have been met. The ending conditions are met when (1) all the containers have been visited and the partitioning was successful for every iteration, (2) when the partitioning has failed, but the maximum number of iterations has been reached, or (3) the partitioning fails because no initial legal placement can be found.

At step 500, the system initializes a window W of depth d to include the root container of H by setting k equal to zero. In the specific embodiment, d is initially set to one. The variable k represents the level of the root container within window W. FIG. 7 shows an example of an initial window placement where k is set equal to zero and d is set equal to one.

Still referring to FIG. 10, the system calls the algorithm at step 510 using window W. First, the ending conditions are checked in steps 512 and 520. In step 512 the process looks for the degenerative case in which the root container of the window has no children. This represents the situation in which the process has reached the leaf containers and there is nothing in the window to partition. Since there is no partitioning needed, the partitioning is successful for that window. So, if the root container has no children, then a status variable is set to succeed in step 514 and the algorithm is terminated in step 516.

If the root container has children, then a counter, iterations_allowed, is initialized in step 520 to keep track of how many iterations remain to be performed. It is initialized to the integer variable max_interations. In step 522, iterations_allowed is checked to determine if the algorithm has used the maximum number of iterations. If so, then the algorithm is terminated at step 516.

If the maximum number of iterations has not been performed (which it will not have been on the first iteration,) then iterations_allowed is decremented to maintain the count in step 524. Then, in step 526 the software may adjust the parameters of the cost function. For example, if some resources are getting scarce, the value of w may be adjusted to make the cost of that resource higher.

The algorithm next performs an initial placement of all the logic cells within W at step 530. For example, the logic cells may be initially placed by a greedy clustering process. A greedy clustering process places each logic cell in the container that will increase the cost function for the window by the least amount at the time it is placed, without regard to its overall effect. A greedy algorithm is generally used because it is uncomplicated and allows the initial placement to complete quickly. Of course, other types of initial placements may be used such as random placement, or sequential placement.

If no legal initial placement can be found, in step 532 the process branches to step 534 in which the cause of the problem is recorded and the status variable is set to fail. The system records the problems for later use. For example, a list of elements that could not be successfully placed may be formed. In the specific embodiment, the list may include secondary signals, such as clocks and clears, that could not feed their destination logic elements due to a lack of secondary signal resources in LAB 200 or other violated constraint. After recording the problems, the application terminates at step 516.

Step 532 is not required to be a hard and fast test by this invention. It may be desirable to allow an initial placement in which some of the cells are placed illegally in the hope that a legal placement will be found at a later time.

After the initial placement, in step 538 the system may again adjust the parameters of the system. Then, at step 540, the algorithm performs a multi-way partition on the logic cells within W. Any number of multi (or d+1)-level, multi-way partitioning procedures may be performed within W. During partitioning, the effects of all logic cell placements in W are typically considered for containers in all levels. A preferable multi-way partitioning method is taught by the present inventors in copending and coassigned U.S. patent application, Ser. No. 08/863,880 entitled "Gain Matrix for Hierarchical Circuit Partitioning" filed May 27, 1997, and incorporated herein by reference for all purposes. However, other techniques may also be used. If d is equal to one, a 2-level multi-way partitioning procedure may be utilized as described in Sanchis, "Multiple-Way Network Partitioning," IEEE Transactions on Computers, Vol. 38, No. 1, pages 62–81 (January 1989), which is hereby incorporated by reference for all purposes. Additionally, a repeated pairwise Kernighan-Lin type bipartitioning procedure may be utilized as described in Kernighan et al., "An Efficient Heuristic Procedure for Partitioning Graphs," The Bell System Technical Journal, pages 291–307 (February 1970) or Krishnamurthy, "An Improved Min-cut Algorithm for Partitioning VLSI Networks," IEEE Transactions on Computers, vol. C-33, No. 5, pages 438–446 (May 1984), both of which are hereby incorporated by reference for all purposes. Furthermore, a simulated annealing procedure may be utilized as described in Chatterjee et al., "A New Simultaneous Circuit Partitioning and Chip Placement Approach Based on Simulated Annealing," Proceedings of Design Automation Conference, pages 36–39 (1990), which is hereby incorporated by reference for all purposes. As stated earlier, the goal of partitioning is to place all logic cells within W legally and minimize F( ).

In step 542, the algorithm determines if all the logic cells are legally placed within the hierarchical structure. If not, then the problems are recorded in step 534, the status variable is set to fail, and the algorithm is terminated. If so, the partitioning has succeeded for this window. Again, it may be desirable to allow some partitions to have illegal placement for intermediate steps.

As will be discussed below, if a legal partition cannot be found for a given window, the window may be inflated as shown in FIG. 9 to find a legal partition. Step 546 determines if this has been done and if so, the algorithm deflates the window back to its original size in step 548.

In either event, the next step is step 550. In step 550, the algorithm recursively calls itself for each child of the root node of the current window. In other words, for each child of the root node, the window slides down making the child the root node of the new window. The window may be moved in the manner shown in FIG. 8 (i.e., k=k+l). As the window is moved to each of the children containers, the algorithm recursively calls itself using the child container as the root node of the new window. After returning from the recursion, the window is slid back up to its original position.

The algorithm next determines in step 560 if the partition has been successful for all of the children. If it has, then in step 514 the status is recorded as succeed and the algorithm is terminated. If it has not been successful for all of the children, then another iteration is attempted to try and find a successful partition.

In step 565, the algorithm determines if the window is inflatable. It is not inflatable if it is already as large as the max_bottom_containers_in_window allows. It is also not inflatable if the allow_to_inflate variable is not set, or if the root container of H is already contained in the window. If the window is inflatable, then in step 570 it is inflated as shown in FIG. 9. The inflation may be done by increasing the value of d. After inflating the window, the partitioning is repeated by returning to step 522 using the inflated window. This gives the algorithm a better chance at partitioning successfully, however it requires increased time and resources to complete a partitioning on a bigger window.

Even if the window is not inflatable, then the algorithm attempts partitioning again by returning to step 522. In this case however, it has the additional recorded information about why it failed before. From this recorded information some cells can be identified as "difficult", and get preferential treatment in the next iteration. For example, the weight wk for a particular level may be decreased to allow more chance to have a legal partition. However, as discussed above, only a set number of iterations are allowed. Once that number is reached, the algorithm terminates.

Figure 11:
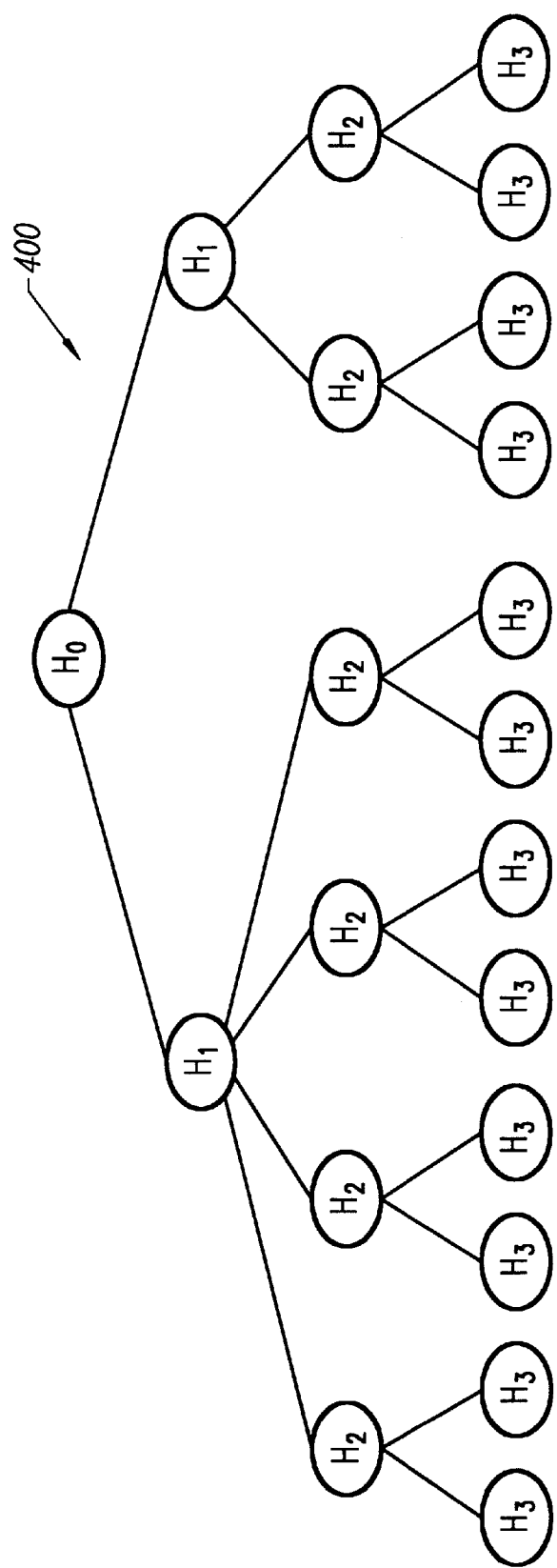
FIG. 11 shows a heterogeneous hierarchical structure representative of a PLD.

The preceding discussion has described hierarchical partitioning within a homogeneous hierarchical structure. However, the invention is not limited to homogenous hierarchical structures. For example, the techniques of the present invention may be advantageously applied to the heterogeneous hierarchical structure of FIG. 11.

Although the invention provides efficient techniques for partitioning logic cells of a circuit into a hierarchical structure, it provides other advantages as well. For example, within the window, logic cells are not only partitioned to satisfy the resource limit and minimize the cost, but descendant containers are also analyzed. Additionally, as the window may be slid up to account for encountered problems, the partitioning of higher level containers may utilize information from lower level containers. Still further, the invention lends itself well to parallel processing, as multiple sliding windows may be analyzed in parallel. Typically, no container in one sliding window is allowed to be a descendant of a container in another sliding window when the sliding windows are analyzed in parallel.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications, and thereby, enable others skilled in the art to best utilize the invention in various embodiments and with various modifications as are suited to the particular use contemplated. It is intended that the scope of the invention be defined by the claims appended hereto along with their full scope of equivalents.

What is claimed is:

1. A method of partitioning a network of interconnected elements comprising:

providing a hierarchical graph representing interconnected resources with nodes of the hierarchical graph representing resources and edges of the graph representing interconnections between the resources;

assigning the elements to nodes of the hierarchical graph;

selecting a first portion of the nodes of the hierarchical structure as a window;

partitioning the elements within the window;

if the elements within the window at a given node are not legally partitioned during partitioning, identifying a reason said elements were not legally partitioned;

recording said reason;

moving the window to a different location on the hierarchical structure, thereby selecting a second portion of the nodes as the window; and repeating the partitioning step, the identifying step, and the recording step.

2. The method of claim 1, further comprising repeating the moving step and the repeating step until all the elements are legally partitioned.

3. The method of claim 1 wherein the moving step and the repeating step are executed recursively.

4. The method of claim 3, further comprising executing recursively the moving step and the repeating step until all the elements are legally partitioned.

5. The method of claim 1, further comprising the steps of:

moving the window to the given node; and partitioning the elements within the window taking into account the recorded reason.

6. The method of claim 1 wherein the partitioning minimizes a cost function of the containers within the window.

7. The method of claim 1 wherein the hierarchical structure is selected from the group consisting of homogeneous and heterogeneous structures.

8. The method of claim 1 wherein the window is moved in an order selected from the group consisting of depth-first order and breadth-first order.

9. The method of claim 1 wherein the partitioning includes a procedure selected from the group consisting of a 2-level multi-way partitioning, repeated pairwise Kernighan-Lin type bipartitioning, and simulated annealing.

10. The method of claim 1 wherein the elements are logic elements of a programmable logic device.

11. A programmable logic device having been partitioned by the method of claim 10.

12. The method of claim 1 further comprising:

assigning weight values to the nodes;

calculating a cost function for the nodes within the window based on the weight value; and partitioning the nodes within the window according to the cost function.

13. The method of claim 12 further comprising revising the weight values based on availability of the resources for a particular node.

14. The method of claim 12 wherein the cost function is calculated by multiplying a cut size by the weight value.

15. The method of claim 12 further comprising adjusting the weight values after the partitioning.

16. A method of partitioning a network of interconnected elements to resources in a hierarchical structure comprising:

providing a hierarchical graph representing interconnected resources with nodes of the hierarchical graph representing resources and edges of the graph representing interconnections between the resources;

assigning the elements to nodes of the hierarchical graph;

selecting a first portion of the nodes of the hierarchical structure as a window;

partitioning the elements within the window;

if the elements within the window at a given node are not legally partitioned during partitioning, identifying a reason said elements were not legally partitioned;

recording said reason;

moving the window to a different location on the hierarchical structure, thereby selecting a second portion of the nodes as the window;

selectively inflating the window to include more nodes; and repeating the partitioning step.

17. The method of claim 16 wherein the window is inflated to include nodes of the hierarchical structure that include previously legally partitioned elements.

18. The method of claim 16, further comprising the step of deflating the window to its original size once the elements within the window are legally partitioned.

19. The method of claim 16 wherein the window initially includes a root node of the hierarchical structure.

20. In a computer system, a method of partitioning a network of interconnected elements into a hierarchical structure comprising:

providing a hierarchical graph representing the hierarchical structure, the hierarchical graph having a root node;

defining a window, a root node within the window being the root node of the hierarchical graph;

partitioning the logic elements to nodes within the window, wherein when the elements cannot be legally partitioned within the window, identifying and recording a reason said elements were not legally partitioned;

defining a subgraph for each descendant node of the root node; and recursively executing the defining step, the partitioning step, the defining step, and the recursively executing step for each subgraph, wherein the subgraph is the hierarchical graph for the recursive execution.

21. The method of claim 20 further comprising taking the recorded reason into account when partitioning the logic elements.

22. The method of claim 20 further comprising:

when the elements cannot be legally placed within the window, inflating the window partitioning the logic elements in the inflated window and then deflating the window.

23. The method of claim 20 further comprising:

assigning weight values to the nodes;

calculating a cost function for the nodes within the window based on the weight value; and partitioning the nodes within the window according to the cost function.

* * * * *